US005981361A

United States Patent [19]

Yamada

[11] Patent Number: 5,981,361

[45] Date of Patent: Nov. 9, 1999

[54] FABRICATION PROCESS OF A SEMICONDUCTOR DEVICE INCLUDING A DICING PROCESS OF A SEMICONDUCTOR WAFER

[75] Inventor: Yutaka Yamada, Kawasaki, Japan

[73] Assignee: Fujitsu Limited, Kanagawa, Japan

[21] Appl. No.: 08/927,209

[22] Filed: Sep. 11, 1997

[30] Foreign Application Priority Data

Sep. 13, 1996 [JP] Japan .................................... 8-243686

[51] Int. Cl.[6] .................................................. H01L 21/301

[52] U.S. Cl. .......................... 438/464; 438/460; 438/113; 438/458; 438/977

[58] Field of Search .................................... 438/460, 464, 438/113, 458, 977

[56] References Cited

U.S. PATENT DOCUMENTS

| | | | |
|---|---|---|---|
| 5,238,876 | 8/1993 | Takeuchi et al. | 438/464 |
| 5,534,102 | 7/1996 | Kadono et al. | 156/250 |
| 5,578,133 | 11/1996 | Sugino et al. | 134/2 |
| 5,622,900 | 4/1997 | Smith | 438/464 |
| 5,641,714 | 6/1997 | Yamanaka | 438/14 |
| 5,733,814 | 3/1998 | Flesher et al. | 438/460 |
| 5,759,874 | 6/1998 | Okawa | 438/124 |

*Primary Examiner*—Peter Toby Brown
*Assistant Examiner*—Khanh Duong
*Attorney, Agent, or Firm*—Armstrong, Westerman, Hattori, McLeLand & Naughton

[57] ABSTRACT

A method of fabricating a semiconductor device includes the steps of, after sawing a semiconductor substrate into individual semiconductor chips in a state that the semiconductor substrate is covered by an adhesive tape, applying a dry gas to the adhesive tape in a state that the adhesive tape carries thereon the semiconductor chips, applying an infrared radiation to the adhesive tape in a state that the adhesive tape carries thereon the semiconductor chips, and curing the adhesive layer on the adhesive tape in a state that the adhesive tape carries thereon the semiconductor chips, by irradiating a ultraviolet radiation to the adhesive tape, wherein the step of applying the dry gas, the step of applying the infrared radiation and the said step of curing the adhesive layer are conducted substantially simultaneously.

11 Claims, 5 Drawing Sheets

21
10
16M
5
11
15
14
3
6
12
13
4
16
9
25
22
23
24
8
2
17
18
7
6'
6''

FIG.7
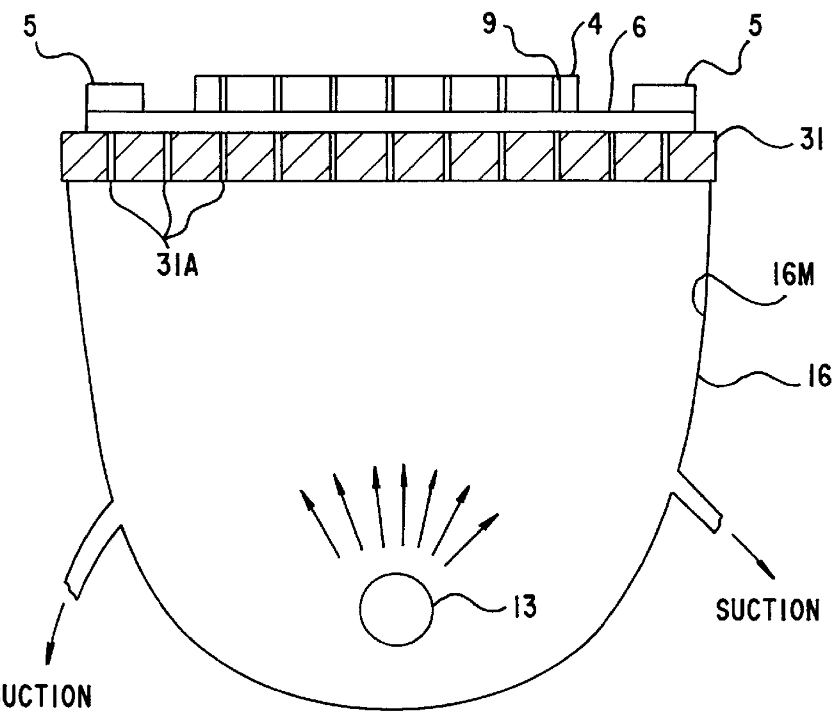
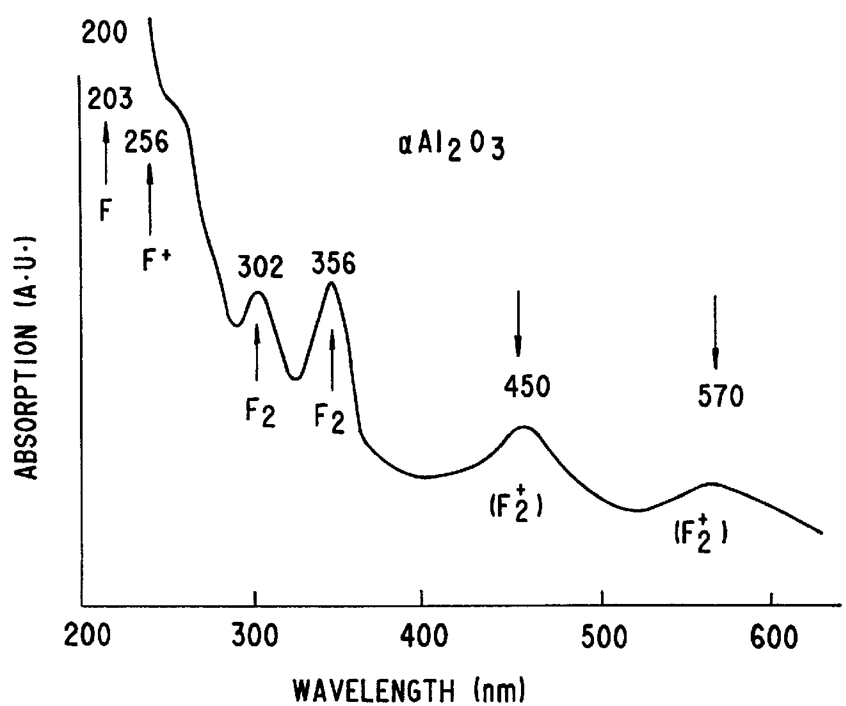
FIG.8
PRIOR ART

FABRICATION PROCESS OF A SEMICONDUCTOR DEVICE INCLUDING A DICING PROCESS OF A SEMICONDUCTOR WAFER

BACKGROUND OF THE INVENTION

The present invention generally relates to fabrication of semiconductor devices and more particularly to a fabrication process of a semiconductor device including a dicing process of a semiconductor wafer and an apparatus therefor.

In a fabrication process of semiconductor devices, a very large number of semiconductor devices are formed commonly on a single semiconductor wafer. The semiconductor wafer thus formed with the semiconductor devices are then divided into individual semiconductor chips by a dicing process that includes a sawing process conducted by a dicing saw.

In a such dicing process, it is commonly practiced to protect the semiconductor wafer, on which semiconductor devices are already formed, by an adhesive tape, such that the semiconductor devices are not damaged by the sawing process achieved by a dicing saw. The sawing may be conducted such that the depth of the dicing grooves, formed as a result of the action of the dicing saw, exceeds the thickness of the semiconductor wafer (full-cut dicing), or alternatively such that the depth of the dicing grooves is smaller than the wafer thickness (semi-full-cut dicing). Further, it is practiced to use an adhesive tape carrying a UV (ultraviolet)-cure type adhesive layer on a tape base for the foregoing adhesive tape, for facilitating the removal of the tape after the semiconductor wafer is divided into individual semiconductor chips. The tape base is typically formed of a polyvinyl chloride resin or a polyolefin resin.

After such a sawing process or alternatively during the sawing process, a cleaning process is conducted for removing dust particles formed as a result of the sawing, by applying a jet of a cleaning liquid such as water. Further, a first drying process is conducted immediately after the cleaning process for eliminating the cleaning liquid by applying an air jet.

In addition to the foregoing first drying process, it has been necessary, in the conventional dicing process, to conduct a second drying process, particularly in the case of the full-cut process, for removing water from the dicing grooves. In the dicing grooves, which are formed as a result of the sawing of the semiconductor wafer by the dicing saw, it should be noted that the adhesive layer on the tape base is exposed. This second drying process is conducted in view of the fact that the UV-curing of the adhesive layer tends to become imperfect when the UV-curing of the resin is conducted under a condition in which the adhesive layer is covered by a medium that contains oxygen such as water. Thus, it has been practiced in the conventional dicing process to carry out the second drying process in a dry $N_2$ environment for at least 30 minutes.

Thus, when a six-inch semiconductor wafer is to be divided into semiconductor chips each having a size of 5 mm×5 mm in the conventional dicing process, it takes about 5 minutes for sawing the semiconductor wafer into individual semiconductor chips, about 1 minute for the cleaning process as well as for the first drying process, about 30 minutes or more for the second drying process, about 1 minute for manually transporting the semiconductor chips from a dicing saw to an UV-curing apparatus together with the adhesive tape, and about 1 minute for curing the adhesive layer on the tape in the UV-curing apparatus. In addition, there may be an extra time needed for setting the semiconductor chips on the UV-curing apparatus in the state that the chips are held on the adhesive tape.

Thus, it will be understood that the conventional fabrication process of semiconductor devices has suffered from the problem of low throughput of production, primarily due to the existence of the second drying process in the dicing process. When the second drying process is eliminated, on the other hand, the adhesive tape remains sticky in correspondence to the part of the tape where the dicing grooves are formed, and the semiconductor chips may carry uncured, sticky adhesives thereon when the chips are picked up from the tape. When this occurs, the yield of production of the semiconductor device in the later process, such as the packaging process, may be deteriorated.

SUMMARY OF THE INVENTION

Accordingly, it is a general object of the present invention to provide a novel and useful method of fabricating a semiconductor device and an apparatus therefor wherein the problems described heretofore are successfully eliminated.

Another and more specific object of the present invention is to provide a fabrication process of a semiconductor device that can successfully reduce the time, and hence cost, needed for a dicing process for dividing a semiconductor wafer into individual semiconductor chips.

Another object of the present invention is to provide a method of improving the yield of production of semiconductor devices, by eliminating the damaging of semiconductor chips that may occur in a dicing process when transporting the semiconductor chips, divided from a common semiconductor wafer in the dicing process, from a sawing unit to a UV-curing unit in the state that the semiconductor chips are held on a flexible adhesive tape.

Another object of the present invention is to provide a method of fabricating a semiconductor device, comprising the steps of:

covering a surface of a semiconductor substrate by an adhesive tape carrying thereon an ultraviolet-curing type adhesive layer;

sawing said semiconductor substrate into individual semiconductor chips in a state that said semiconductor substrate is covered by said adhesive tape;

applying a dry gas to said adhesive tape in a state that said adhesive tape carries thereon said semiconductor chips;

applying an infrared radiation to said adhesive tape in a state that said adhesive tape carries thereon said semiconductor chips; and curing said adhesive layer on said adhesive tape in a state that said adhesive tape carries thereon said semiconductor chips, by irradiating an ultraviolet radiation to said adhesive tape;

said step of applying said dry gas, said step of applying said infrared radiation and said step of curing said adhesive layer being conducted substantially simultaneously.

Another object of the present invention is to provide an apparatus for fabricating a semiconductor device, comprising:

an ultraviolet radiation source;

a lamp house body surrounding said ultraviolet radiation source, said lamp house body carrying a mirror surface;

an opening provided on said lamp house body, said opening being adapted for supporting semiconductor chips arranged on an adhesive tape;

an infrared radiation source provided in said lamp house body, such that said infrared radiation source is surrounded by said lamp house body; and an air nozzle disposed such that said air nozzle applies a dry gas to said semiconductor substrate held on said opening.

According to the present invention, the drying process for eliminating water or moisture from the part of the adhesive tape corresponding to the dicing grooves is conducted substantially concurrently to the curing process of the ultraviolet-curing resin, and the throughput of production of the semiconductor devices is improved substantially. As the curing of the adhesive layer is thus conducted in a dry environment substantially free from water or moisture, the curing of the adhesive layer proceeds completely and the problem of decreased yield of the semiconductor device production, caused as a result of the partially cured adhesive layer sticking to the semiconductor chips, is successfully and effectively avoided. Further, as the sawing of the semiconductor substrate is conducted in the state that the semiconductor substrate is protected by the adhesive tape, mechanical damage to the semiconductor chips is minimized during the dicing process.

Another object of the present invention is to provide a method of fabricating a semiconductor device, comprising the steps of:

covering a surface of a semiconductor substrate by an adhesive tape carrying thereon an ultraviolet-curing type adhesive layer;

holding said semiconductor substrate on an opening of a lamp house including therein an ultraviolet radiation source, in a state that said semiconductor substrate is covered by said adhesive tape; and sawing said semiconductor substrate into individual semiconductor chips in a state that said semiconductor substrate is held on said opening of said lamp house.

Another object of the present invention is to provide an apparatus for fabricating a semiconductor device, comprising:

an ultraviolet radiation source;

a lamp house body surrounding said ultraviolet radiation source, said lamp house body carrying a mirror surface;

an opening provided on said lamp house body; and a vacuum chuck provided on said lamp house body so as to cover said opening, said vacuum chuck being adapted for supporting a semiconductor substrate thereon in a state that said semiconductor substrate is covered by said adhesive tape;

said vacuum chuck being formed of a material substantially transparent to an ultraviolet radiation produced by said ultraviolet radiation source.

According to the present invention, the dicing of the semiconductor substrate is carried out on the lamp house of the ultraviolet radiation source. Thereby, the process of transporting the diced semiconductor chips to the ultraviolet radiation source is no longer necessary, and the problem of the semiconductor chips being damaged during the transportation process due to the downward bulging of the tape, which in turn is caused by the gravity acting on the semiconductor chips, is successfully eliminated.

Other objects and further features of the present invention will become apparent when read in conduction with the attached drawings.

BRIEF DESCRIPTION OF THE DRAWINGS

FIG. 7 is a diagram showing the construction of a dicing apparatus according to a third embodiment of the present invention in a curing step; and FIG. 8 is a diagram showing the absorption spectrum of $Al_2O_3$.

DETAILED DESCRIPTION OF THE PREFERRED EMBODIMENTS

[First Embodiment]

Figure 1:
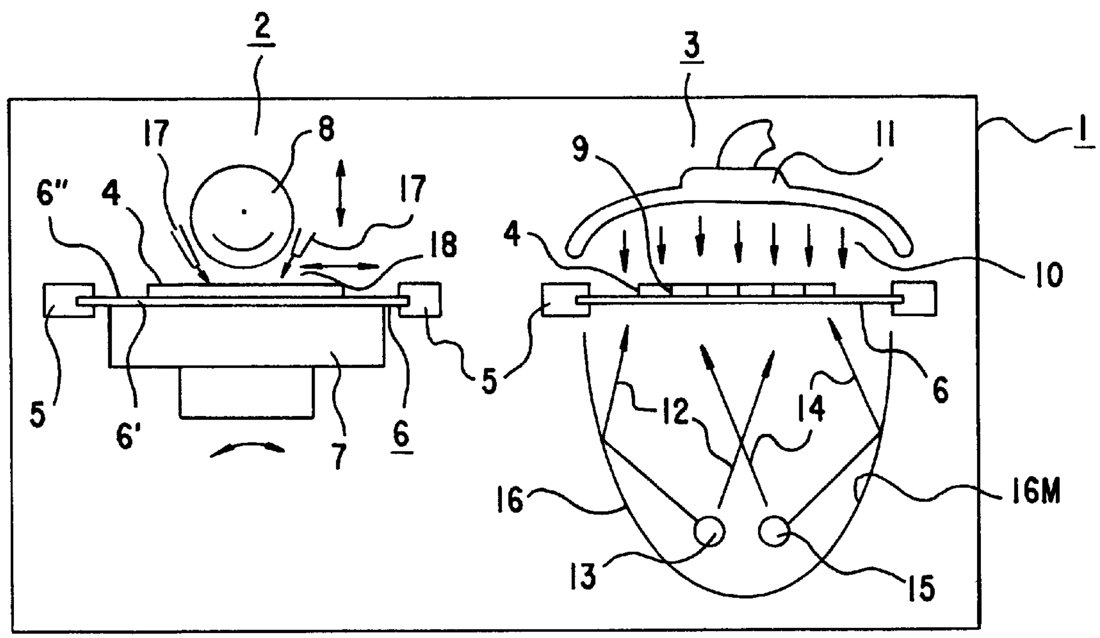
FIG. 1 is a diagram showing the construction of a dicing apparatus according to a first embodiment of the present invention.

FIG. 1 shows the construction of a dicing apparatus 1 used in a first embodiment of the present invention for dicing a semiconductor wafer.

Referring to FIG. 1, the dicing apparatus 1 includes a sawing unit 2 for sawing a semiconductor wafer 4 in the state that the semiconductor wafer 4 is protected by an adhesive tape 6, and a curing unit 3 for curing an adhesive layer 6" on the adhesive tape 6, by applying an ultraviolet radiation thereto. It should be noted that the adhesive tape 6 includes, in addition to the foregoing adhesive layer 6", a tape base 6' of typically a polyvinyl chloride resin or a polyolefin resin.

The sawing unit 2 includes a dicing table carrying thereon a vacuum chuck 7, wherein the vacuum chuck 7 is adapted to hold thereon the semiconductor wafer 4 in a state that the semiconductor wafer 4 is covered by the adhesive tape 6, by applying a vacuum to the tape 6. On the vacuum chuck 7, there is disposed a rotary dicing saw 8 and a cooling water nozzle 17 that applies a cooling liquid 18 to the dicing saw 8 as well as to the semiconductor wafer 4. It should be noted that the tape 6 is mounted on the vacuum chuck 7 in a state that the tape 6 is tensioned on a frame 5 firmly.

In operation, the dicing saw 8 is rotated at a high speed, and the dicing table is moved back and forth together with the vacuum chuck 7 thereon, as indicated by arrows in FIG. 1. Alternatively, the dicing saw 8 is moved in the back and forth directions. Further, the vacuum chuck 7 is rotatable together with the dicing table as indicated by arrows in FIG. 1. Furthermore, the dicing saw 8 is movable vertically in the upward and downward directions as indicated in FIG. 1 by arrows.

As a result of the relative movement of the rotating dicing saw 8 and the semiconductor wafer 4, the wafer 4 is cut by the dicing saw 8 along the predetermined scribe lines, and there are formed dicing grooves in the semiconductor wafer 4 in correspondence to the scribe lines. In the full-cut process, the surface of the adhesive tape, on which the adhesive layer is formed, is exposed as a result of the formation of the dicing grooves. The semiconductor chips thus formed are held on the tape 6 in the desired row and column formation as a result of the adherence of the adhesive tape 6, and the problem of scattering of the semiconductor chips is successfully avoided.

During the foregoing cutting or sawing process, the dicing saw 8 is cooled by the cooling liquid 18 sprayed upon the dicing saw 8 from the spray nozzle 17 as noted previously, wherein a purified water or a diluted soda water may be used for the cooling liquid 18. The cooling liquid 18 not only cools the dicing saw 8 but also the semiconductor wafer 4. Further, the cooling liquid 18 washes away the dust particles that are formed as a result of the sawing of the semiconductor wafer 4.

The curing unit 3, on the other hand, includes a UV lamp 13 that emits a UV radiation 12 and a lamp house 16 that carries a mirror surrounding the lamp 13. The lamp house 16 further includes an opening for emitting the UV radiation produced by the UV lamp 13 to the exterior of the lamp house 16.

Thus, the adhesive tape 6 held on the frame 5 is dismounted, after the sawing of the semiconductor wafer 4 is completed, from the vacuum chuck 7 of the sawing unit 2 by a carrier mechanism not illustrated. The adhesive tape 6 thus dismounted carries thereon the semiconductor chips formed as a result of the sawing process and is accommodated into a cassette not illustrated. The cassette is then transported to the curing unit 3 by a robot, and the adhesive tape 6 held by the frame 5 is mounted on the foregoing opening of the lamp house 16. The tape 6 thus mounted on the opening of the lamp house 16 carries thereon the semiconductor chips formed as a result of the sawing process, as noted already, wherein the semiconductor chips on the tape 6 are held in the state that the chips are separated from each other by dicing grooves 9. As already noted, the adhesive layer 6" of the tape 6 is exposed in correspondence to the dicing grooves 9.

In addition to the foregoing UV lamp 13, it should be noted that the lamp house 16 of the curing unit 3 includes an infrared lamp 15 emitting an infrared radiation 14 adjacent to the UV lamp 13. Thus, by energizing the infrared lamp 15 simultaneously to the UV lamp 13, it becomes possible to remove the moisture or water from the dicing grooves 9 as a result of heating caused by the infrared radiation 14 emitted by the infrared lamp 15, wherein the foregoing drying of the tape 6 can be conducted simultaneously to the curing of the adhesive layer 6" on the tape 6, by simultaneously energizing the UV lamp 13. The heating of the tape 6 by the infrared lamp 15 is particularly effective for removing water or moisture from the dicing grooves 9.

Further, the construction of FIG. 1 includes, in addition to the infrared lamp 15, an air nozzle 11 above the lamp house 16 such that the air nozzle 11 faces the tape 6 in a state that the tape 6, carrying thereon the semiconductor chips, is mounted on the foregoing opening of the lamp house 16. The air nozzle 11 thereby applies a dry gas 10 preferably a dry inert gas such as $N_2$ or alternatively a dry air to the tape 6 for facilitating the removal of water or moisture from the dicing grooves 9.

For example, the curing of the adhesive layer 6" can be completed within a matter of 1–5 seconds, by applying a dry $N_2$ gas from the nozzle 11 with a flow rate of 10 liters/min while energizing the UV lamp 13 with a power of achieving a radiation of about 450 $mW/cm^2$, and simultaneously energizing the infrared lamp 15 such that the tape 6 is heated to a temperature of 90–140° C. Thereby, the secondary drying process is no longer necessary.

In order to facilitate the drying of the tape 6, it is preferable to heat the tape 6 to a temperature of about 90° C. or higher, while in view of the heat resistance of the tape 6, which uses polyolefin for the tape base 6', the temperature has to be held lower than about 140° C.

In the case the dicing apparatus 1 of FIG. 1 is used for dicing a semiconductor wafer having a diameter of 6 inches into semiconductor chips each having a size of 5 mm×5 mm, it takes only about 5 minutes for sawing the wafer by the sawing unit 2, several seconds for transporting the wafer from the sawing unit 2 to the curing unit 3, and several seconds for curing in the curing unit 3. Thus, the dicing process is completed in a very short time, and the throughput of production of the semiconductor devices is improved substantially. As the sawing of the wafer is conducted in the state that the wafer is protected by the adhesive tape, the problem of damages caused in the semiconductor chips as a result of the sawing process is effectively eliminated.

[Second Embodiment]

Figure 2:
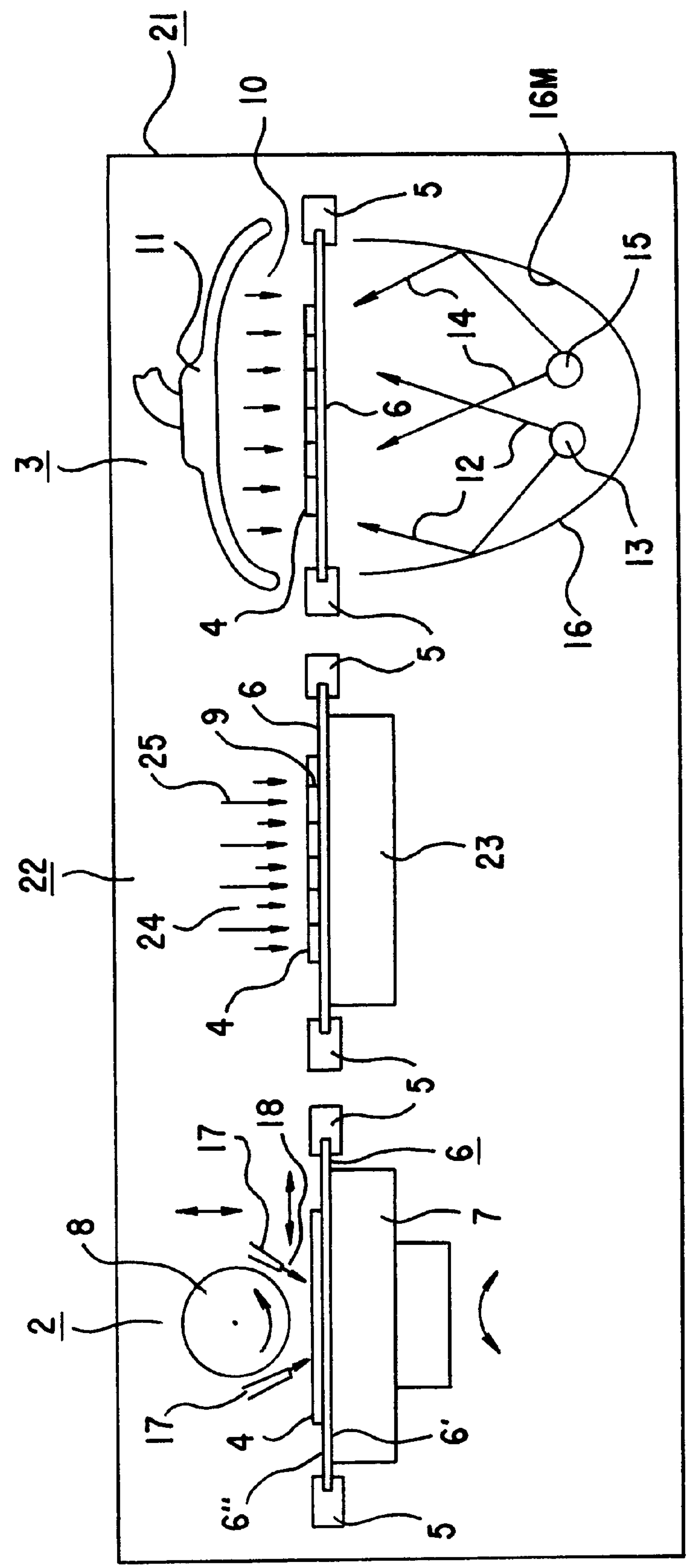
FIG. 2 is a diagram showing the construction of a dicing apparatus according to a second embodiment of the present invention.

FIG. 2 shows the construction of a dicing apparatus 21 according to a second embodiment of the present invention, wherein those parts described previously with reference to preceding drawings are designated by the same reference numerals and the description thereof will be omitted.

Referring to FIG. 2, the dicing apparatus 21 further includes, between the sawing unit 2 and the curing unit 3, a cleaning unit 22. The cleaning unit 22 includes a support table 23 for supporting the adhesive tape 5, mounted on the frame 5 and carrying the semiconductor chips thereon, by engaging the rear surface of the tape 6, a spray nozzle (not shown) for spraying a cleaning liquid 24 upon the tape 6 and the semiconductor wafer 4 held on the support table 23, and an air nozzle (not shown) for spraying a dry gas 25 such as dry air to the foregoing semiconductor wafer 4.

Thus, in the cleaning unit 22, the semiconductor wafer 4 is cleaned by the cleaning liquid 24 and the dust particles remaining on the wafer 4 are washed away. Further, by applying the dry air 25, the remaining cleaning liquid 24 is removed, although the drying process conducted by the dry air 25 is not sufficient for removing the cleaning liquid 24 completely from the dicing grooves, and the drying process in the curing unit 23 cannot be eliminated.

As indicated in FIG. 2, the wafer 4 on the table 23 is formed with the dicing grooves 9 as a result of the sawing in the sawing unit 2. The transportation of the wafer 4 from the sawing unit 2 to the cleaning unit 22 and further from the cleaning unit 22 to the curing unit 3 is achieved also by a robot not illustrated.

Figure 3:
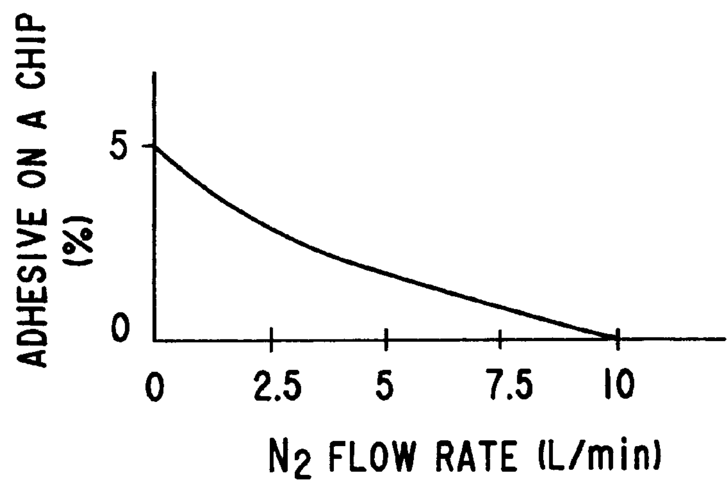
FIG. 3 is a diagram showing the relationship between the amount of the adhesives sticking to a semiconductor chip and the flow rate of a dry $N_2$ gas applied in a curing unit of FIG. 1 or FIG. 2.
Figure 4:
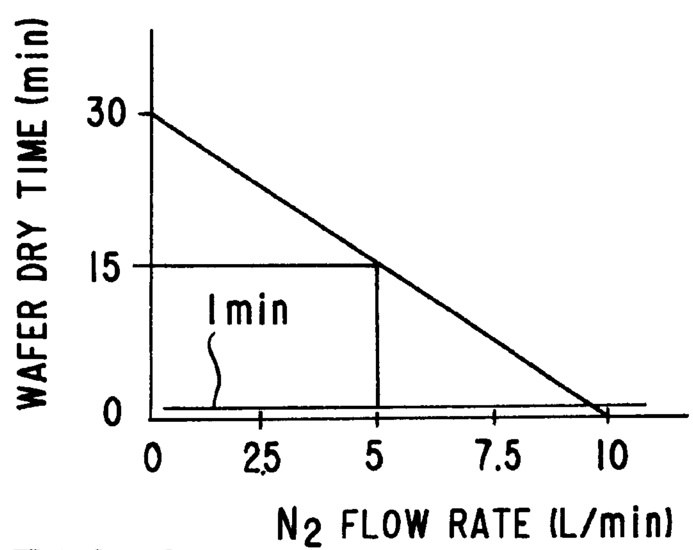
FIG. 4 is a diagram showing the relationship between the time needed for drying a wafer and the flow rate of a dry $N_2$ gas applied in the curing unit of FIG. 1 or FIG. 2.

FIG. 3 shows the relationship between the amount of the uncured adhesive adhered to the chip and the flow rate of the $N_2$ gas sprayed from the nozzle 11, for a case in which the radiation of the lamp 13 is set to 450 $mJ/cm^2$. Further, FIG. 4 shows the relationship between the time needed for the wafer 4 to be dried completely including the dicing grooves 9 and the flow rate of the $N_2$ gas from the nozzle 11 for the case in which the radiation of the lamp 13 is set to 450 $mJ/cm^2$.

Referring to FIG. 3, it will be understood that the amount of the uncured adhesive transferred to the chip is reduced to almost zero when the $N_2$ gas flow rate is set to about 10 liter/minutes or more. Further, FIG. 4 indicates that the time needed for drying the wafer 4 completely is reduced to about 1 minute or less by setting the flow rate of the $N_2$ gas to about 10 liter/minutes or more. In the case the $N_2$ gas flow rate is set to about 5 liter/minutes, it takes about 15 minutes for the wafer 4 to be dried completely.

[Third Embodiment}

Figure 5A:
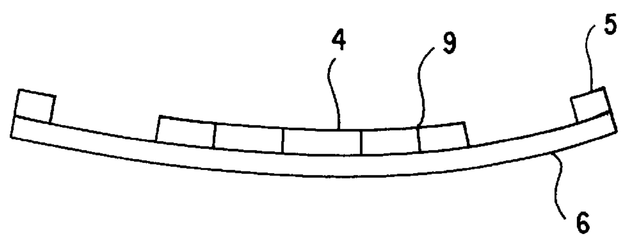
FIG. 5A and 5B are diagrams explaining the problem that occurs when transporting semiconductor chips together with an adhesive tape.

In the dicing apparatus 1 of FIG. 1 or in the dicing apparatus 21 of FIG. 2, it should be noted that the adhesive tape 6 tends to be bent in the downward direction as indicated in FIG. 5A by the gravity when the wafer 4 is transported from the sawing unit 2 to the cleaning unit 22 or from the cleaning unit 22 to the curing unit 3. Such a downward bending of the tape 6 is more or less inevitable even when the tape 6 is tensioned upon the frame 5 firmly. When such a bending occurs in the tape 6, there is a substantial risk that the semiconductor chips on the tape 6, such as semiconductor chips 4A and 4B shown in FIG. 5B may contact with each other. When such a mechanical contact occurs between adjacent chips, there is a substantial risk that the semiconductor chips are damaged.

Figure 5B:
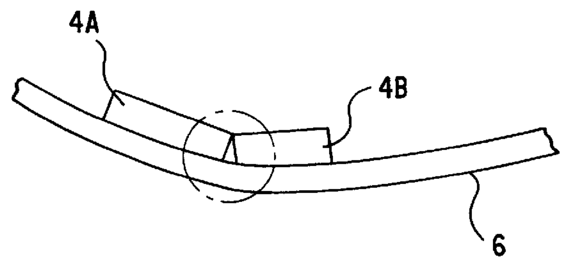

This problem did not emerge in conventional fabrication process of semiconductor devices due to the relatively large width (about 150 $\mu$m) for the dicing grooves as compared with the thickness of the wafer 4, while in these days, there is a tendency that the width of the dicing groove 9 is reduced, for example to about 90 $\mu$m or less, for increasing the number of chips obtained from a single semiconductor wafer. Thus, the problem of damaging of the semiconductor chips shown in FIG. 5B is becoming a material problem. It should be noted that this problem becomes particularly conspicuous in recent large diameter wafers having a diameter of 8 inches or 12 inches, in which the amount of the downward bending of the tape 6 reaches as much as 1.5–2 mm.

In order to avoid this problem, there is a proposal to hold the frame 5, when transporting the semiconductor wafer 4, by a vacuum suction mechanism, such that the tape 6 is bulged in the upward direction. However, such a vacuum suction of the tape 6, while successfully eliminating the interference of the semiconductor chips 4A and 4B, may induce a stress in the semiconductor chip at the surface contacting the tape 6, and there is a substantial risk that the minute device pattern or wiring pattern on the surface of the semiconductor chip may be damaged. Further, the application of suction to the tape tends to cause the dust particles to float behind the tape 6, while such drifting dust particles may cause a damage to the semiconductor chips.

Figure 6:
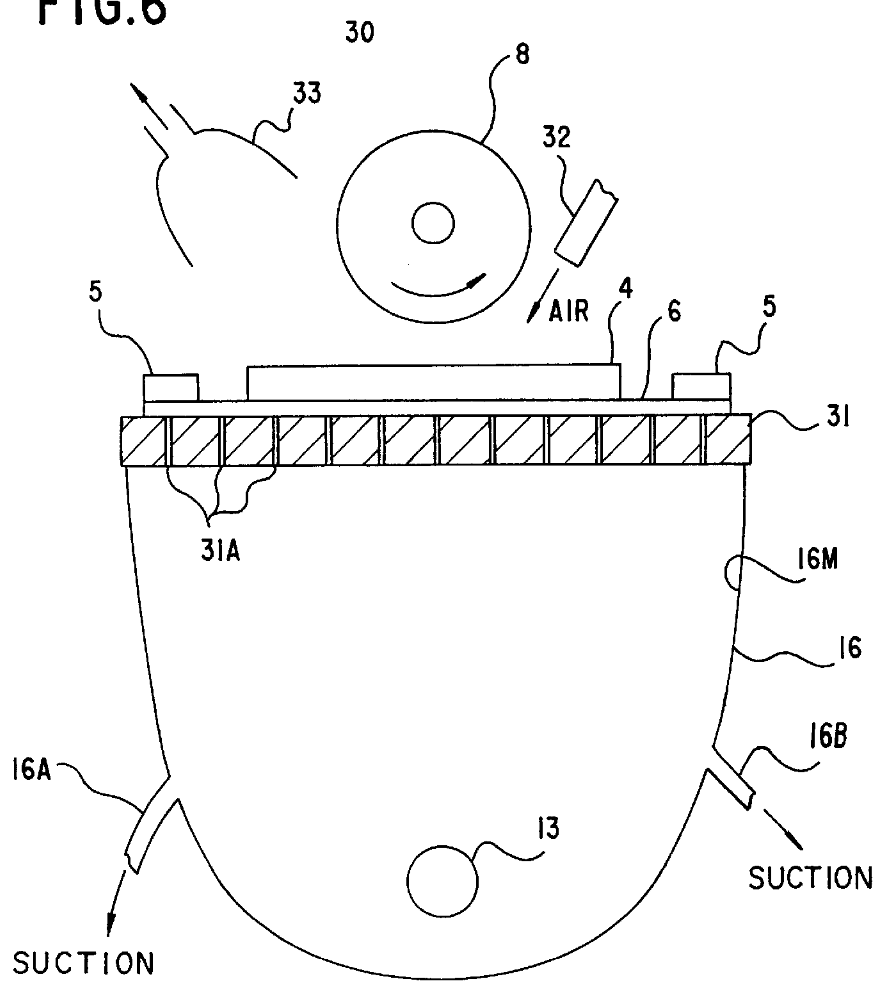
FIG. 6 is a diagram showing the construction of a dicing apparatus according to a third embodiment of the present invention in a sawing step.

In view of the foregoing problems of the prior art process, the present embodiment uses a vacuum chuck 31, formed of a material substantially transparent to the ultraviolet radiation such as an acrylic resin, on the opening of the UV lamp house 16, in which the UV-lamp 13 is accommodated, and the semiconductor wafer 4 is held on the vacuum chuck 31 in the state that the wafer 4 is protected by the adhesive tape 6 as indicated in FIG. 6. In FIG. 6, it should be noted that those parts corresponding to the parts described previously are designated by the same reference numerals and the description thereof will be omitted.

As indicated in FIG. 6, the tape 6 is tensioned by the frame 5, and the vacuum chuck 31 sucks the tape 6 in the state that the tape 6 holds thereon the semiconductor wafer 4. The acrylic resin plate forming the vacuum chuck may have a total thickness of 15–20 nm and is formed with a number of minute penetrating holes 31A. Further, the lamp house 16 is formed with evacuation ports 16A and 16B.

In the construction as such, the semiconductor wafer 4 is cut by the rotating dicing saw 8 in the state that the semiconductor wafer 4 is held on the opening of the lamp house 16 by the vacuum chuck 31. Thereby, a cooling air or $N_2$ gas is applied to the dicing blade 8 from an air nozzle 32 for cooling the dicing blade 8 and for removing the dust particles formed as a result of the sawing process. The dust particles are collected by a dust collector 33 disposed above the vacuum chuck 31.

Thus, FIG. 6 shows the sawing process of the wafer 4 conducted on the lamp house 16, wherein it should be noted that the UV lamp 13 is not energized in the sawing process of FIG. 6.

After the sawing process of FIG. 6 is completed, the cutter blade 8, the air nozzle 32 and the dust collector 33 are moved by a moving mechanism not illustrated to a position for allowing picking-up of the individual semiconductor chips by a robot hand. Next, in the step of FIG. 7, the UV lamp 13 is energized until the adhesive layer 6' on the tape 6 is cured completely.

In the foregoing processes, it should be noted that the need of transporting the semiconductor chips from the sawing unit 2 to the curing unit 3 is successfully eliminated, and the problem of interference of the chips on the tape 6 explained with reference to FIG. 5B is successfully eliminated. Thereby, the yield of production of the semiconductor devices is improved substantially.

It should be noted that the material forming the vacuum chuck 31 is not limited to an acrylic resin plate but other material transparent to an UV-radiation such as $Al_2O_3$ may be used.

FIG. 8 shows the optical absorption of $Al_2O_3$.

Referring to FIG. 8, it will be noted that the optical absorption of $Al_2O_3$, is small in the visible wavelength band above the wavelength of about 400 nm, while the optical absorption increases sharply in the optical wavelength below about 280 nm. On the other hand, the optical absorption remains relatively low in the wavelength range between about 400 nm and about 280 nm, thus allowing the use of $Al_2O_3$ for the material of the vacuum chuck 31. As a slab of $Al_2O_3$ is porous, the vacuum chuck 31 of $Al_2O_3$ can successfully suck the adhesive tape 6 thereon, without forming penetrating holes 31A.

In an experiment conducted on the apparatus of FIG. 6 and 7 for dicing a Si wafer having a diameter of 8 inches, it was confirmed that not a single semiconductor chip has caused the interference indicated in FIG. 5B, even when the width of the dicing grooves is reduced to about 30 $\mu$m or further to about 15 $\mu$m. On the other hand, it was confirmed that about 3% of the semiconductor chips cause the interference when the dicing process is conducted conventionally.

Summarizing above, it is concluded that the process and apparatus of the present embodiment are effective for improving the yield of production of semiconductor devices. Further, the throughput of production of semiconductor devices is improved also as a result of elimination of the process for transporting the semiconductor chips from the sawing unit to the curing unit.

Further, the present invention is not limited to the embodiments described heretofore, but various variations and modifications may be made without departing from the scope of the invention.

What is claimed is:

1. A method of fabricating a semiconductor device, comprising the steps of:

covering a surface of a semiconductor substrate by an adhesive tape carrying thereon a ultraviolet-curing type adhesive layer;

sawing said semiconductor substrate into individual semiconductor chips in a state that said semiconductor substrate is covered by said adhesive tape;

applying a dry gas to said adhesive tape in a state that said adhesive tape carries thereon said semiconductor chips;

applying an infrared radiation to said adhesive tape in a state that said adhesive tape carries thereon said semiconductor chips; and curing said adhesive layer on said adhesive tape in a state that said adhesive tape carries thereon said semiconductor chips, by irradiating a ultraviolet radiation to said adhesive tape;

said step of applying said dry gas, said step of applying said infrared radiation and said step of curing said adhesive layer being conducted substantially simultaneously.

2. A method as claimed in claim 1, further including a step, after said sawing step but before said drying step, of cleaning said semiconductor substrate by a cleaning liquid.

3. A method as claimed in claim 1, wherein said step of applying infrared radiation is conducted such that said infrared radiation is applied to a side of said adhesive tape opposite to the side carrying thereon said semiconductor wafer.

4. A method as claimed in claim 1, wherein said step of drying is conducted by applying said dry gas to a side of said adhesive tape carrying said semiconductor wafer.

5. A method as claimed in claim 1, wherein said step of curing is conducted by applying an ultraviolet radiation to a side of said adhesive tape opposite to the side carrying thereon said semiconductor wafer.

6. A method as claimed in claim 1, wherein said step of sawing is conducted such that a dicing groove formed in said semiconductor wafer as a result of said sawing has a depth equal to a thickness of said semiconductor wafer.

7. A method as claimed in claim 1, wherein said step of curing is conducted such that a temperature of said adhesive tape rises to a range between about 90° C. and about 140° C.

8. A method as claimed in claim 1, further including a step, after said step of curing, of detaching said adhesive tape from said semiconductor chips.

9. A method of fabricating a semiconductor device, comprising the steps of:

covering a surface of a semiconductor substrate by an adhesive tape carrying thereon a ultraviolet-curing type adhesive layer;

holding said semiconductor substrate on an opening of a lamp house including therein an ultraviolet radiation source, in a state that said semiconductor substrate is covered by said adhesive tape; and sawing said semiconductor substrate into individual semiconductor chips in a state that said semiconductor substrate is held on said opening of said lamp house.

10. A method as claimed in claim 9, wherein said step of holding said semiconductor substrate includes the steps of placing said semiconductor substrate on a vacuum chuck substantially transparent to ultraviolet radiation, in a state that said semiconductor substrate is covered by said adhesive tape, and urging said semiconductor substrate upon said vacuum chuck by evacuating said lamp house.

11. A method as claimed in claim 9, further including a step, after said sawing step, of curing said adhesive tape in a state that said adhesive tape, carrying thereon said semiconductor chips, is held on said opening of said lamp house, said curing step including a step of energizing said ultraviolet radiation source.

* * * * *